United States Patent
Gupta et al.

(10) Patent No.: US 11,282,580 B2
(45) Date of Patent: Mar. 22, 2022

(54) DATA STORAGE DEVICE WITH FOGGY-FINE PROGRAM SEQUENCE FOR REDUCING NEIGHBOR WORDLINE INTERFERENCE

(71) Applicant: Western Digital Technologies, Inc., San Jose, CA (US)

(72) Inventors: Mayank Gupta, Bangalore (IN); Phani Raghavendra Yasasvi Gangavarapu, Bangalore (IN); Arun Balakrishnan, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/887,747

(22) Filed: May 29, 2020

(65) Prior Publication Data

US 2021/0375376 A1 Dec. 2, 2021

(51) Int. Cl.
*G11C 16/00* (2006.01)
*G11C 16/34* (2006.01)
(Continued)

(52) U.S. Cl.
CPC ........ *G11C 16/3427* (2013.01); *G06F 3/0604* (2013.01); *G06F 3/0659* (2013.01);
(Continued)

(58) Field of Classification Search
CPC . G11C 16/0483; G11C 11/5628; G11C 16/10; G11C 16/3427; G11C 16/26; G11C 11/5642; G11C 16/08; G11C 16/3418; G11C 16/3459; G11C 11/5671; G11C 16/24; G11C 2211/5641; G11C 16/32; G11C 2211/5621; G11C 13/0061; G11C 16/0408; G11C 16/0466; G11C 16/30; G11C 16/34; G11C 16/3404; G11C 16/349; G11C 2211/5648; G11C 11/5635; G11C 16/14; G06F 12/0246; G06F 2212/7202; G06F 2212/7203; G06F 3/064; G06F 2212/7205; G06F 3/0679; G06F 11/00; G06F 11/1048; G06F 11/1068; G06F 11/1072; H01L 27/11582; H01L 27/11524; H01L 27/1157; H01L 27/11556; H01L 27/11565; H01L 27/11519
USPC ............ 365/185.17, 185.03, 185.18, 185.19, 365/185.22, 185.02, 185.09, 185.11, 365/18.12, 185.21, 185.24, 185.28, 365/185.08; 711/103, E12.008, E12.001, (Continued)

(56) References Cited

U.S. PATENT DOCUMENTS

2012/0155166 A1* 6/2012 Li .................. G11C 11/5628
365/185.03

* cited by examiner

*Primary Examiner* — Thong Q Le
(74) *Attorney, Agent, or Firm* — Michael Best & Friedrich LLP

(57) ABSTRACT

A memory controller includes, in one embodiment, a memory interface and a controller circuit. The memory interface is configured to interface with a memory having a plurality of wordlines. The controller circuit is configured to program, with foggy-fine programming, a first portion of the plurality of wordlines to store first program data, program, with the foggy-fine programming, one or more wordlines of the plurality of wordlines in a non-fine state, the one or more wordlines neighboring the first portion, and program, with the foggy-fine programming, a second portion of the plurality of wordlines to store second program data, the second portion neighboring the one or more wordlines.

20 Claims, 9 Drawing Sheets

(51) Int. Cl.
 *G11C 16/10* (2006.01)
 *G11C 16/08* (2006.01)
 *G06F 3/06* (2006.01)
 *G11C 16/14* (2006.01)
 *G11C 16/04* (2006.01)

(52) U.S. Cl.
 CPC ............ *G06F 3/0679* (2013.01); *G11C 16/08* (2013.01); *G11C 16/10* (2013.01); *G11C 16/14* (2013.01); *G11C 16/0483* (2013.01)

(58) Field of Classification Search
 USPC ... 711/E12.009, E12.04, 114, 136, 165, 170, 711/209
 See application file for complete search history.

| | STRING 0 *302* | STRING 1 *304* | STRING 2 *306* | STRING 3 *308* | |
|---|---|---|---|---|---|
| *310* WL0 | FINE | FINE | FINE | FINE | |
| *312* WL1 | FINE | FINE | FINE | FINE | |
| ••• | FINE | FINE | FINE | FINE | *324* |
| *314* WLn-1 | FINE | FINE | FINE | FINE | |
| *316* WLn | FINE | FINE | FINE | FINE | |
| *318* WLn+1 | ERASE | ERASE | ERASE | ERASE | |
| *320* WLn+2 | ERASE | ERASE | ERASE | ERASE | |
| ••• | ERASE | ERASE | ERASE | ERASE | *326* |
| *322* WL95 | ERASE | ERASE | ERASE | ERASE | |

FIG. 3

DATA STORAGE DEVICE WITH FOGGY-FINE PROGRAM SEQUENCE FOR REDUCING NEIGHBOR WORDLINE INTERFERENCE

BACKGROUND

This application relates generally to memory devices and, more particularly, to a controller in a memory device that performs a foggy-fine program sequence.

An increase in failed bit counts in a BiCS4 X4 quad-level cell (QLC) memory, for example, occurs due to less threshold voltage Vt margin between foggy-fine programming. High failed bit count (FBC) is observed at the edge wordline (WL) in an open block high temperature condition, which is due to neighbor wordline interference (NWI).

SUMMARY

The present disclosure includes devices, methods, and apparatuses to either program the wordline (referred to herein as "WLn+1") neighboring the edge wordline (referred to herein as "WLn") with dummy data or skip programming WLn+1 neighboring WLn entirely. The devices, systems, and apparatuses of the present disclosure reduces the NWI.

For example, one solution of the present disclosure is to initially program WLn+2 with a foggy programming before programming WLn+1 with fine programming. In this example, the foggy-fine programming sequence is then implemented with WLn+2.

Another solution of the present disclosure is to skip the programming of WLn+1 entirely and proceeding to program WLn+2 with a foggy-fine programming. In this example, the foggy-fine programming sequence is implemented with WLn+2, which leaves WLn+1 in an erase state.

The foggy-fine programming of the present disclosure reduces the neighbor wordline interference at the edge wordline, e.g., WLn. The foggy-fine programming of the present disclosure may be implemented in firmware of a memory controller.

The disclosure provides a memory controller including, in one embodiment, a memory interface and a controller circuit. The memory interface is configured to interface with a memory having a plurality of wordlines. The controller circuit is configured to program, with foggy-fine programming, a first portion of the plurality of wordlines to store first program data, program, with the foggy-fine programming, one or more wordlines of the plurality of wordlines in a non-fine state, the one or more wordlines neighboring the first portion, and program, with the foggy-fine programming, a second portion of the plurality of wordlines to store second program data, the second portion neighboring the one or more wordlines.

The disclosure also provides a method. In one embodiment, the method includes programming, with a controller circuit and foggy-fine programming, a first portion of a plurality of wordlines to store first program data. The method includes programming, with the controller circuit and the foggy-fine programming, one or more wordlines of the plurality of wordlines in a non-fine state, the one or more wordlines neighboring the first portion. The method also includes programming, with the controller circuit and the foggy-fine programming, a second portion of the plurality of wordlines to store second program data, the second portion neighboring the one or more wordlines.

The disclosure also provides an apparatus including, in one embodiment, means for programming, with foggy-fine programming, a first portion of a plurality of wordlines to store first program data using foggy-fine programming, means for programming, with the foggy-fine programming, one or more wordlines of the plurality of wordlines in a non-fine state, the one or more wordlines neighboring the first portion, and means for programming, with the foggy-fine programming, a second portion of the plurality of wordlines to store second program data, the second portion neighboring the one or more wordlines.

In this manner, various aspects of the disclosure provide for improvements in at least the technical fields of memory devices and their design and architecture. The disclosure can be embodied in various forms, including hardware or circuits controlled by computer-implemented methods, computer program products, computer systems and networks, user interfaces, and application programming interfaces; as well as hardware-implemented methods, signal processing circuits, memory arrays, application specific integrated circuits, field programmable gate arrays, and the like. The foregoing summary is intended solely to give a general idea of various aspects of the disclosure, and does not limit the scope of the disclosure in any way.

BRIEF DESCRIPTION OF THE DRAWINGS

FIG. 3 is a table illustrating conventional foggy-fine programming of first program data written in wordlines WL0 to WLn relative to a block of wordlines WL0 to WL95.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the memory device may be performed by hardware (e.g., analog or digital circuits), a combination of hardware and software (e.g., program code or firmware stored in a non-transitory computer-readable medium that is executed by processing or control circuitry), or any other suitable means. The following description is intended solely to give a general idea of various aspects of the disclosure, and does not limit the scope of the disclosure in any way.

Figure 1:
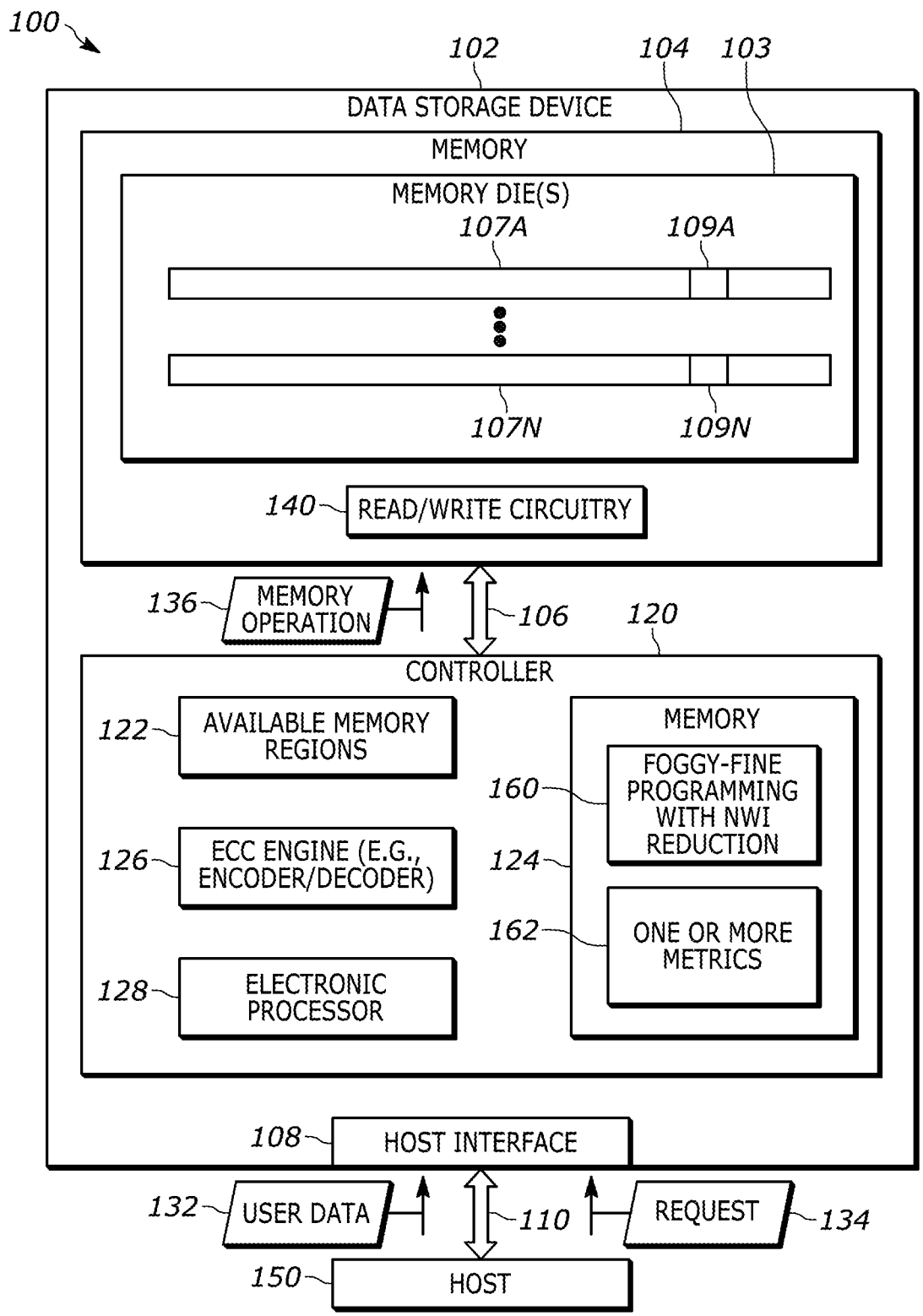
FIG. 1 is block diagram of a system including a data storage device that has a memory storing data based on foggy-fine programming, in accordance with some embodiments of the disclosure.

FIG. 1 is block diagram of a system including a data storage device that has a memory storing data based on foggy-fine programming, in accordance with some embodiments of the disclosure. In the example of FIG. 1, the system 100 includes a data storage device 102 and a host device 150. The data storage device 102 includes a controller 120 and a memory 104 (e.g., non-volatile memory) that is coupled to the controller 120.

The data storage device 102 and the host device 150 may be operationally coupled via a connection (e.g., a communication path 110), such as a bus or a wireless connection. In some examples, the data storage device 102 may be embedded within the host device 150. Alternatively, in other examples, the data storage device 102 may be removable from the host device 150 (i.e., "removably" coupled to the host device 150). As an example, the data storage device 102 may be removably coupled to the host device 150 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 150 via the communication path 110, such as a wired communication path and/or a wireless communication path. For example, the data storage device 102 may include an interface 108 (e.g., a host interface) that enables communication via the communication path 110 between the data storage device 102 and the host device 150, such as when the interface 108 is communicatively coupled to the host device 150.

The host device 150 may include an electronic processor and a memory. The memory may be configured to store data and/or instructions that may be executable by the electronic processor. The memory may be a single memory or may include one or more memories, such as one or more non-volatile memories, one or more volatile memories, or a combination thereof. The host device 150 may issue one or more commands to the data storage device 102, such as one or more requests to erase data at, read data from, or write data to the memory 104 of the data storage device 102. For example, the host device 150 may be configured to provide data, such as user data 132, to be stored at the memory 104 or to request data to be read from the memory 104. The host device 150 may include a mobile smartphone, a music player, a video player, a gaming console, an electronic book reader, a personal digital assistant (PDA), a computer, such as a laptop computer or notebook computer, any combination thereof, or other suitable electronic device.

The host device 150 communicates via a memory interface that enables reading from the memory 104 and writing to the memory 104. In some examples, the host device 150 may operate in compliance with an industry specification, such as a Universal Flash Storage (UFS) Host Controller Interface specification. In other examples, the host device 150 may operate in compliance with one or more other specifications, such as a Secure Digital (SD) Host Controller specification or other suitable industry specification. The host device 150 may also communicate with the memory 104 in accordance with any other suitable communication protocol.

The memory 104 of the data storage device 102 may include a non-volatile memory (e.g., NAND, BiCS family of memories, or other suitable memory). In some examples, the memory 104 may be any type of flash memory. For example, the memory 104 may be two-dimensional (2D) memory or three-dimensional (3D) flash memory. The memory 104 may include one or more memory dies 103. Each of the one or more memory dies 103 may include one or more blocks (e.g., one or more erase blocks). Each block may include one or more groups of storage elements, such as a representative group of storage elements 107A-107N. The group of storage elements 107A-107N may be configured as a word line. The group of storage elements 107 may include multiple storage elements (e.g., memory cells that are referred to herein as a "string"), such as a representative storage elements 109A and 109N, respectively.

The memory 104 may include support circuitry, such as read/write circuitry 140, to support operation of the one or more memory dies 103. Although depicted as a single component, the read/write circuitry 140 may be divided into separate components of the memory 104, such as read circuitry and write circuitry. The read/write circuitry 140 may be external to the one or more memory dies 103 of the memory 104. Alternatively, one or more individual memory dies may include corresponding read/write circuitry that is operable to read from and/or write to storage elements within the individual memory die independent of any other read and/or write operations at any of the other memory dies.

The data storage device 102 includes the controller 120 coupled to the memory 104 (e.g., the one or more memory dies 103) via a bus 106, an interface (e.g., interface circuitry), another structure, or a combination thereof. For example, the bus 106 may include multiple distinct channels to enable the controller 120 to communicate with each of the one or more memory dies 103 in parallel with, and independently of, communication with the other memory dies 103. In some implementations, the memory 104 may be a flash memory.

The controller 120 is configured to receive data and instructions from the host device 150 and to send data to the host device 150. For example, the controller 120 may send data to the host device 150 via the interface 108, and the controller 120 may receive data from the host device 150 via the interface 108. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data.

The controller 120 is configured to send a read command to the memory 104 to access data from a specified address of the memory 104. The read command may specify the physical address of a region of the memory 104 (e.g., a physical address of a word line of the memory 104). The controller 120 may also be configured to send data and commands to the memory 104 associated with background scanning operations, garbage collection operations, and/or wear-leveling operations, or other suitable memory operations. For example, the controller 120 is configured to send data and commands to the memory 104 according to the foggy-fine programming that reduces neighbor wordline interference as described in FIGS. 6-8.

The controller 120 may include available memory regions 122, a memory 124, an error correction code (ECC) engine 126, and an electronic processor 128. The available memory regions 122 may indicate a pool of free regions of the memory 104, such as one or more regions available to store data as part of a write operation. For example, the available memory regions 122 may be organized as a table or other data structure that is configured to track free regions of the memory 104 that are available for write operations.

One example of the structural and functional features provided by the controller 120 are illustrated in FIG. 1. However, the controller 120 is not limited to the structural and functional features provided by the controller 120 in FIG. 1. The controller 120 may include fewer or additional structural and functional features that are not illustrated in FIG. 1.

The memory 124 may be configured to store data and/or instructions that may be executable by the electronic processor 128. The memory 124 may include foggy-fine programming with neighbor wordline interference (NWI) reduction 160 and one or more metrics 162 associated with use of the memory 104. The foggy-fine programming with NWI reduction 160 may be instructions that are executable by the electronic processor 128. The foggy-fine programming with NWI reduction 160 is described in greater detail below with respect to FIGS. 6-8.

The metrics 162 may be tracked on a storage element-by-storage element basis, on a wordline-by-wordline basis, on a block-by-block basis, on a die-by-die basis, or other suitable basis. The one or more metrics 162 may track a program/erase (P/E) count (PEC), a bit error rate (BER), a programming time, an erase time, a number of voltage pulses to program a storage element, a number of voltage pulses to erase a storage element, a combination thereof, or other suitable metrics corresponding to the memory 104.

Figure 2:
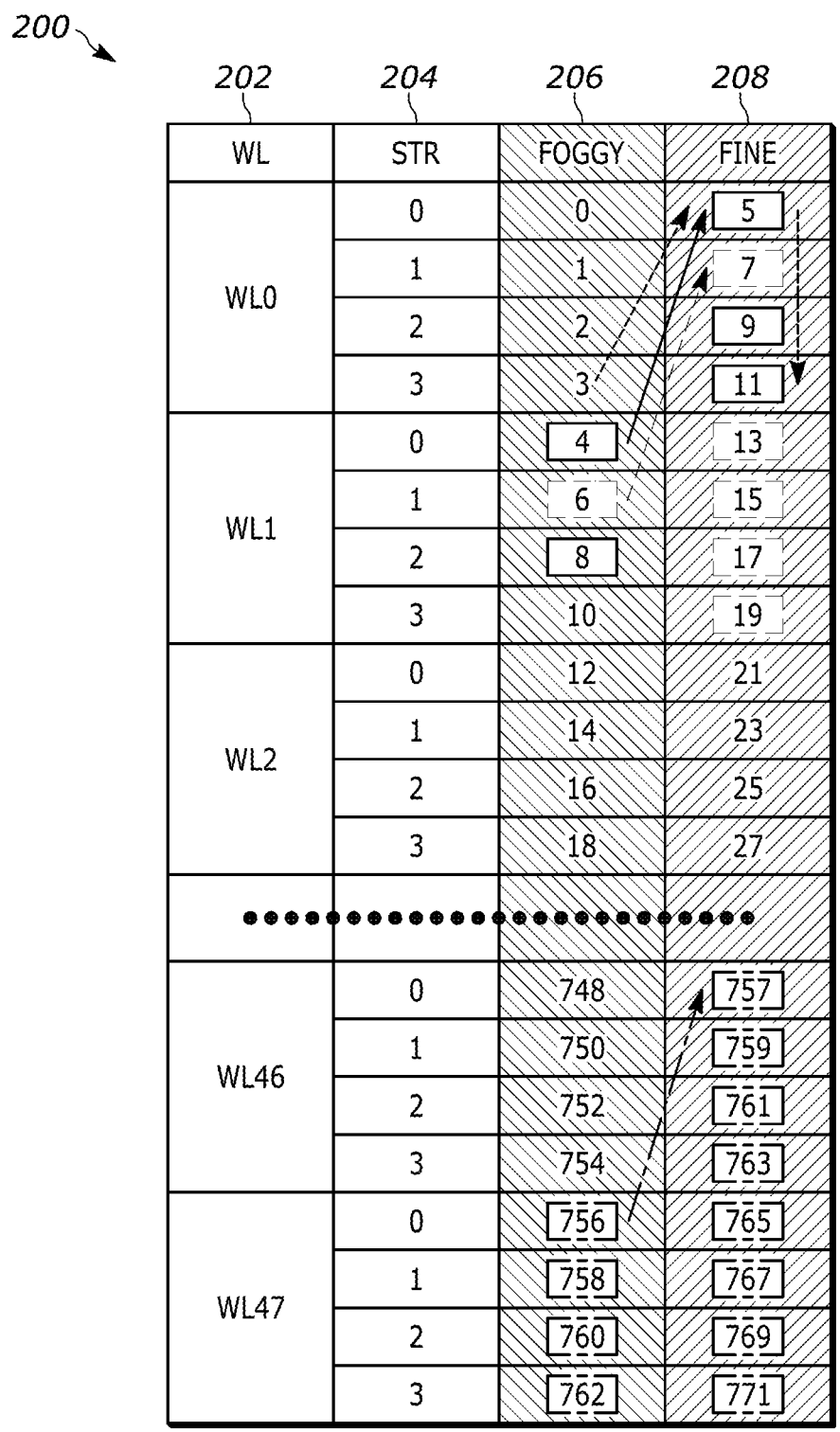
FIG. 2 is table illustrating conventional foggy-fine programming with respect to wordlines WL0 to WL47.

FIG. 2 is table illustrating conventional foggy-fine programming 200 with respect to wordlines WL0 to WL47. The table includes a wordline column 202, a string column 204, a foggy column 206, and a fine column 208. In the wordline column 202, the table includes rows that correspond to wordlines WL0-WL47. In the string column 204, the table includes strings that correspond to wordlines WL0-WL47. In the foggy column 206, the table includes sequential "foggy" write operations that correspond to the strings in the strings column 204. In the fine column 208, the table includes sequential "fine" write operations that correspond to the strings in the strings column 204.

In the example of FIG. 2, the conventional foggy-fine programming 200 is initialized by sequentially programming strings 0-3 of the first wordline WL0 in a foggy state. This sequential programming is illustrated in FIG. 2 as write operations "0-3" in the Foggy column 206.

After programming strings 0-3 of the first wordline WL0 in a foggy state, the conventional foggy-fine programming 200 then programs string 0 of the second wordline WL1 in a foggy state followed by programming string 0 of the first wordline WL0 in a fine state. This programming is illustrated in FIG. 2 as write operation "4" in the Foggy column 206 and as write operation "5" in the Fine column 208.

The conventional foggy-fine programming 200 then iteratively programs one string in a foggy state followed by programming a corresponding string in the previous wordline in a fine state. This iterative programming is illustrated in FIG. 2 as write operations "6 . . . 762" in the Foggy column 206 and as corresponding write operations "7 . . . 763" in the Fine column 208.

FIG. 3 is a table illustrating conventional foggy-fine programming 300 of first program data 324 written in wordlines WL0 and WLn relative to a block of wordlines WL0 to WL95. As illustrated in FIG. 3, the table includes string columns 302-308 (e.g., String 0, String 1, String 2, and String 3) and wordline rows 310-322 (e.g., wordlines WL0, WL1, WLn−1, WLn, WLn+1, WLn+2, and WL95).

Foggy-fine programming is a two-step programming of flash memory with multi-level cells (MLC). In one example of foggy-fine programming, a flash cell is first partially programmed based on its least significant bit (LSB) value, using a binary programming step that uses a large step-pulse to increase the voltage level in the flash cell. After the binary programming step, the flash cell is then partially programmed again based on its center significant bit (CSB) and most significant bit (MSB) values to a temporary "foggy" state with a step-pulse that is smaller than the binary programming step-pulse. After the "foggy" programming step, "fine" programming applies a step-pulse that is smaller than the "foggy" step-pulse to set a final threshold voltage state in the flash cell. In summary, foggy-fine programming is a programming process that programs a rough temporary value, which is then replaced with a final fine-tuned value.

In the example of FIG. 3, the first program data 324 is written in wordlines WL0 through WLn. The remaining wordlines 326 (i.e., WLn+1 through WL95) are still in an erase state and are available to be written as part of a WLn+1 program.

The conventional foggy-fine programming 300 does not write dummy data to, or skip, any wordlines. Similarly, the conventional foggy-fine programming 200 does not write dummy data to, or skip, any wordlines.

Figure 4:
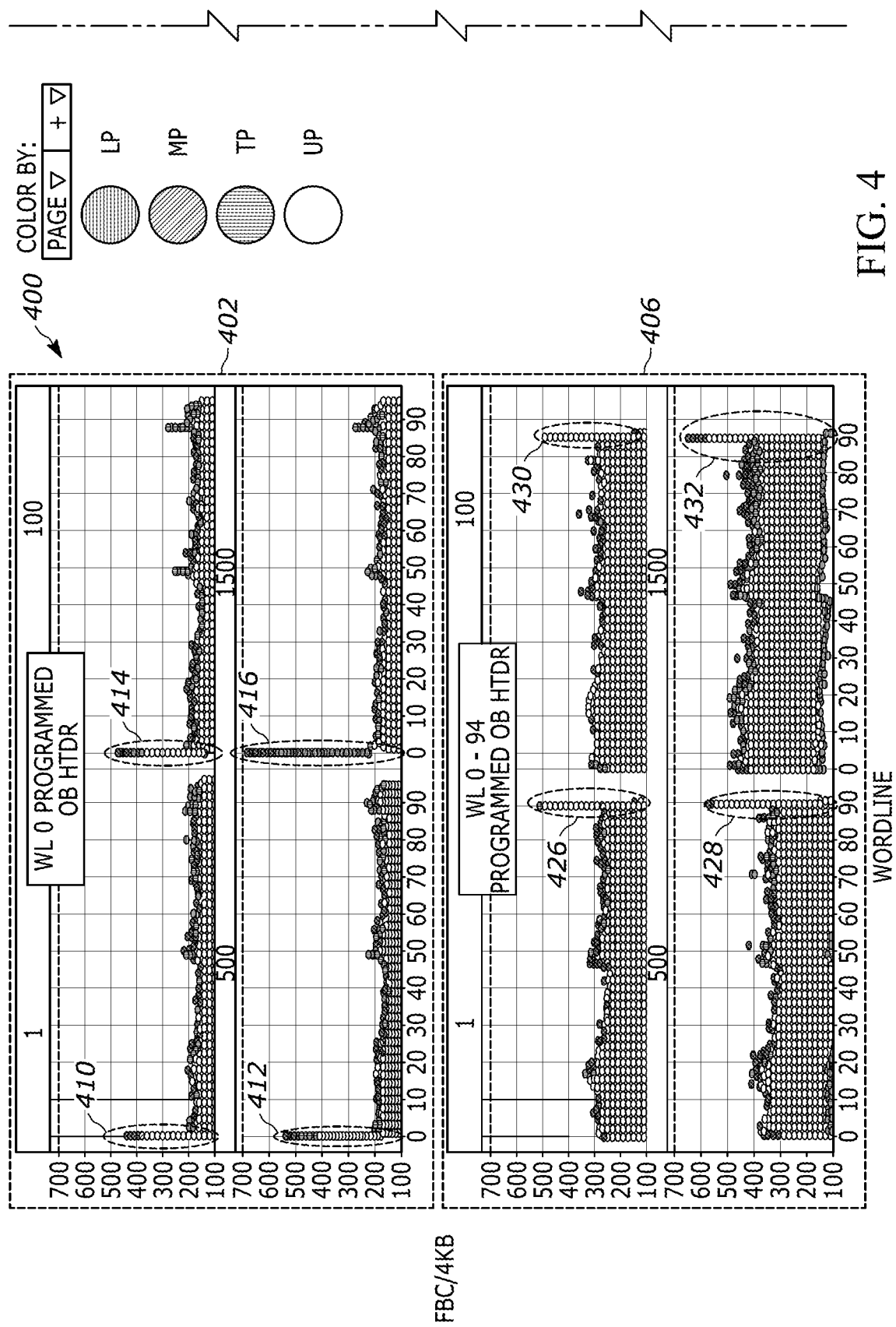
FIG. 4 is a diagram illustrating failed bit counts across wordlines with respect to four different example tests of conventional foggy-fine programming.
Figure 4:
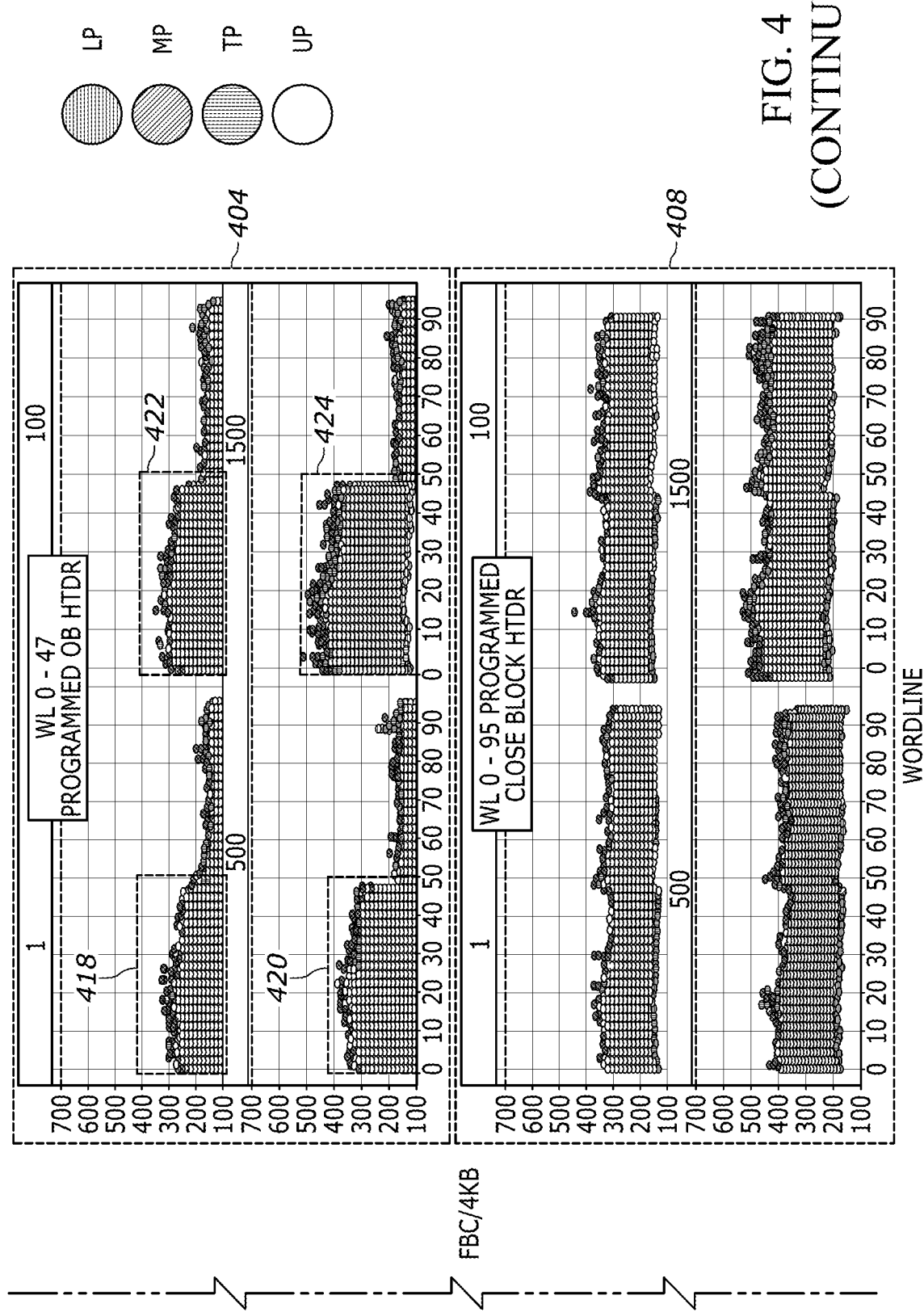

FIG. 4 is a diagram illustrating failed bit counts across wordlines with respect to four different example tests 402-408 of conventional foggy-fine programming. As illustrated in FIG. 4, the first example test 402 of conventional foggy-fine programming is with respect to wordline zero (WL0) programmed in open block (OB) condition during high temperature data retention (HTDR) test. The second example test 404 of conventional foggy-fine programming is with respect to wordline zero (WL0) to wordline forty-seven (WL47) programmed OB HTDR test. The third example test 406 of conventional foggy-fine programming is with respect to wordline zero (WL0) to wordline ninety-four (WL94) programmed OB HTDR test. The fourth example test 408 of conventional foggy-fine programming is with respect to wordline zero (WL0) to wordline ninety-five (WL95) programmed closed block HTDR test.

In the example test 402, a first sub-test has a failed bit count 410 of approximately 450 over four kilobytes. As illustrated in FIG. 4, the "1" represents the set of blocks which did not undergo Program/Erase cycling. The data of the first sub-test corresponds to this set of blocks.

In the example test 402, a second sub-test has a failed bit count 412 of approximately 500 over four kilobytes. As illustrated in FIG. 4, the "100" represents the set of blocks which were Program/Erase cycled 100 times before the OB HTDR experiment. The data of the second sub-test corresponds to this set of blocks.

In the example test 402, a third sub-test has a failed bit count 414 of approximately 550 over four kilobytes. As illustrated in FIG. 4, the "500" represents the set of blocks which were Program/Erase cycled 500 times before the OB HTDR experiment. The data of the third sub-test corresponds to this set of blocks.

In the example test 402, a fourth sub-test has a failed bit count 416 of approximately 700 over four kilobytes. As illustrated in the example test 402 of FIG. 4, the NWI is clearly causing a spike of failed bits to occur in wordline WL0. As illustrated in FIG. 4, the "1500" represents the set of blocks which were Program/Erase cycled 1500 times before the OB HTDR experiment. The data of the fourth sub-test corresponds to this set of blocks.

In the example test 404, a first sub-test has a failed bit count section 418 with an average of approximately 300 over four kilobytes. In the example test 404, a second sub-test has a failed bit count section 420 with an average of approximately 300 over four kilobytes. In the example test 404, a third sub-test has a failed bit count section 422 with an average of approximately 350 over four kilobytes. In the example test 404, a fourth sub-test has a failed bit count section 424 with an average of approximately 450 over four kilobytes. As illustrated in the example test 404 of FIG. 4, the data retention is clearly causing failed bits to occur in wordlines WL0 through WL47, although no spike occurs in any particular wordline because of the presence of a "dummy" wordline adjacent to WL47.

In the example test 406, a first sub-test has a failed bit count 426 of approximately 500 over four kilobytes. In the example test 406, a second sub-test has a failed bit count 428 of approximately 550 over four kilobytes. In the example test 406, a third sub-test has a failed bit count 430 of approximately 500 over four kilobytes. In the example test 406, a fourth sub-test has a failed bit count 432 of approximately 650 over four kilobytes. As illustrated in the example test 406 of FIG. 4, the NWI is clearly causing a spike of failed bits to occur in wordline WL94.

In the example test 408, a first sub-test has a failed bit count an average of approximately 300 over four kilobytes. In the example test 408, a second sub-test has a failed bit count average of approximately 300 over four kilobytes. In the example test 408, a third sub-test has a failed bit count average of approximately 375 over four kilobytes. In the example test 408, a fourth sub-test has a failed bit count average of approximately 450 over four kilobytes. As illustrated in the example test 408 of FIG. 4, there is no NWI effect leading to high FBCs because this is a close block program.

Figures 5, 6:
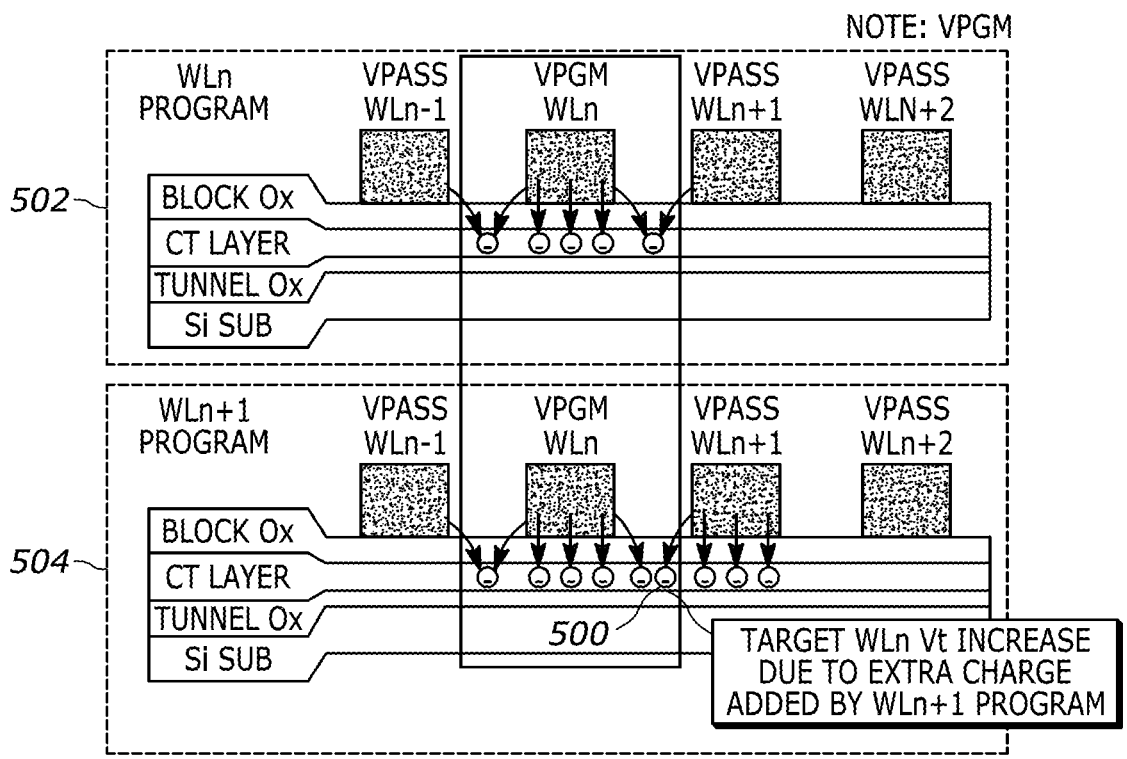
FIG. 5 is a diagram illustrating an extra charge added near WLn during WLn+1 program using conventional foggy-fine programming.
FIG. 6 is a table illustrating foggy-fine programming of first program data between wordlines WL0 and WLn with respect to wordlines WL0 to WL95, in accordance with some embodiments of the disclosure.

FIG. 5 is a diagram illustrating an extra charge 500 in a WLn program 502 added by a WLn+1 program 504 using conventional foggy-fine programming. As illustrated in FIG. 5, the WLn program 502 does not include the extra charge 500. However, the WLn+1 program 504 introduces the extra charge to the WLn program 502. The extra charge 500 increases the threshold voltage at the wordline WLn and represents the neighbor wordline interference from the WLn+1 program 504.

FIG. 6 is a table illustrating foggy-fine programming 600, in accordance with some embodiments of the disclosure. As illustrated in FIG. 6, the table includes string columns 602-608 (e.g., String 0, String 1, String 2, and String 3) and wordline rows 610-622 (e.g., wordlines WL0, WL1, WLn−1, WLn, WLn+1, WLn+2, and WL95).

In the example of FIG. 6, the first program data 624 is written in wordlines WL0 through WLn. However, unlike the conventional foggy-fine programming 300 as described above in FIG. 3, the foggy-fine programming 600 writes either dummy data to the wordline row 618 (i.e., wordline WLn+1) or skips the wordlines row 618 entirely before the foggy-fine programming 600 writes a WLn+2 program to the remaining wordlines 626 (i.e., wordlines WLn+2 through WL95).

For example, after the foggy-fine programming 600 writes the first program data 624 to wordlines WL0 to WLn in a fine state, the foggy-fine programming 600 then programs strings 0-3 of the wordline 618 in a foggy state. Before programming strings 0-3 of the wordline 620 in a foggy state, the foggy-fine programming 600 may program strings 0-3 of the wordline 618 with "dummy data" in a fine state. Thus, the foggy-fine programming 600 initializes the wordline 620 in a foggy state after programming the wordline 618 with "dummy data" in a fine state.

After programming strings 0-3 of the wordline WLn+2 in foggy states, the foggy-fine programming 600 then programs string 0 of the wordline WLn+3 in a foggy state followed by programming string 0 of the wordline WLn+2 in a fine state. This programming is similar to the programming illustrated in FIG. 2 as write operation "4" in the Foggy column 206 and as write operation "5" in the Fine column 208.

The foggy-fine programming 600 then iteratively programs one string in a foggy state followed by programming a corresponding string in the previous wordline in a fine state until the last string of the last wordline is programmed in a fine state (e.g., string 3 of the wordline WL95). This iterative programming is similar to the iterative programming illustrated in FIG. 2 as write operations "6 . . . 756" in the Foggy column 206 and as corresponding write operations "7 . . . 757" in the Fine column 208.

Alternatively, in some examples, after the foggy-fine programming 600 writes the first program data 624 to wordlines WL0 to WLn in a fine state, the foggy-fine programming 600 may skip the wordline 618 entirely. In these examples, the foggy-fine programming 600 may then perform the iterative programming of the remaining wordlines 626. Thus, the foggy-fine programming 600 skips the wordline 618, initializes the wordline 620 in a foggy state, and then proceeds with foggy-fine programming that mimics the foggy-fine programming 300 as described above.

In other examples, the foggy-fine programming 600 may always skip a first wordline entirely. For example, the foggy-fine programming 600 may write first program data to wordlines WL1 to WLn in a fine state, which leaves the wordline WL0 in an erase state, and the foggy-fine programming 600 may perform the iterative programming of the remaining wordlines 626, which leaves the wordline 618 in an erase state.

Figure 7:
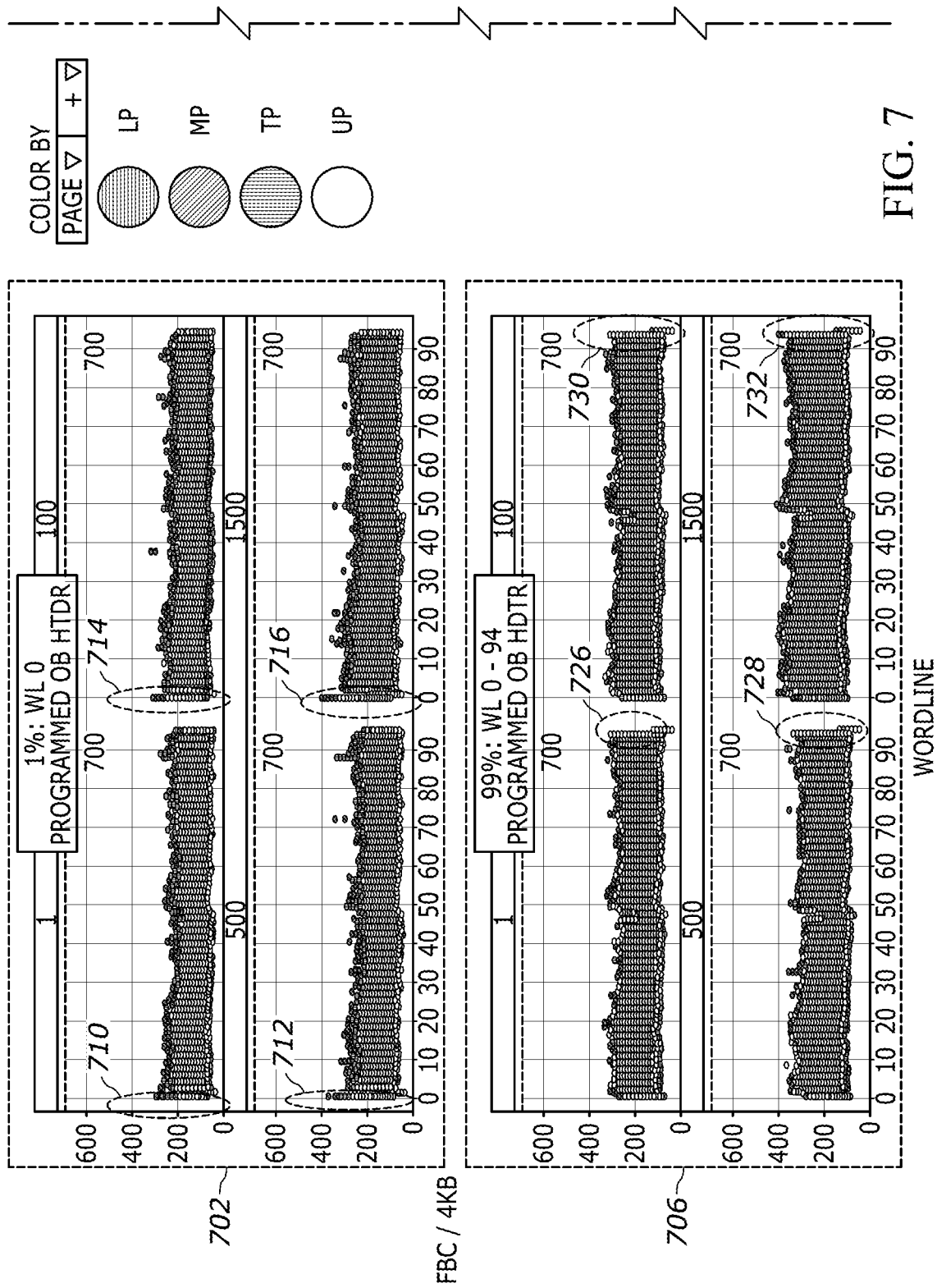
FIG. 7 is a diagram illustrating failed bit counts across wordlines with respect to four different example tests of foggy-fine programming that reduce neighbor wordline interference, in accordance with some embodiments of the disclosure.
Figure 7:
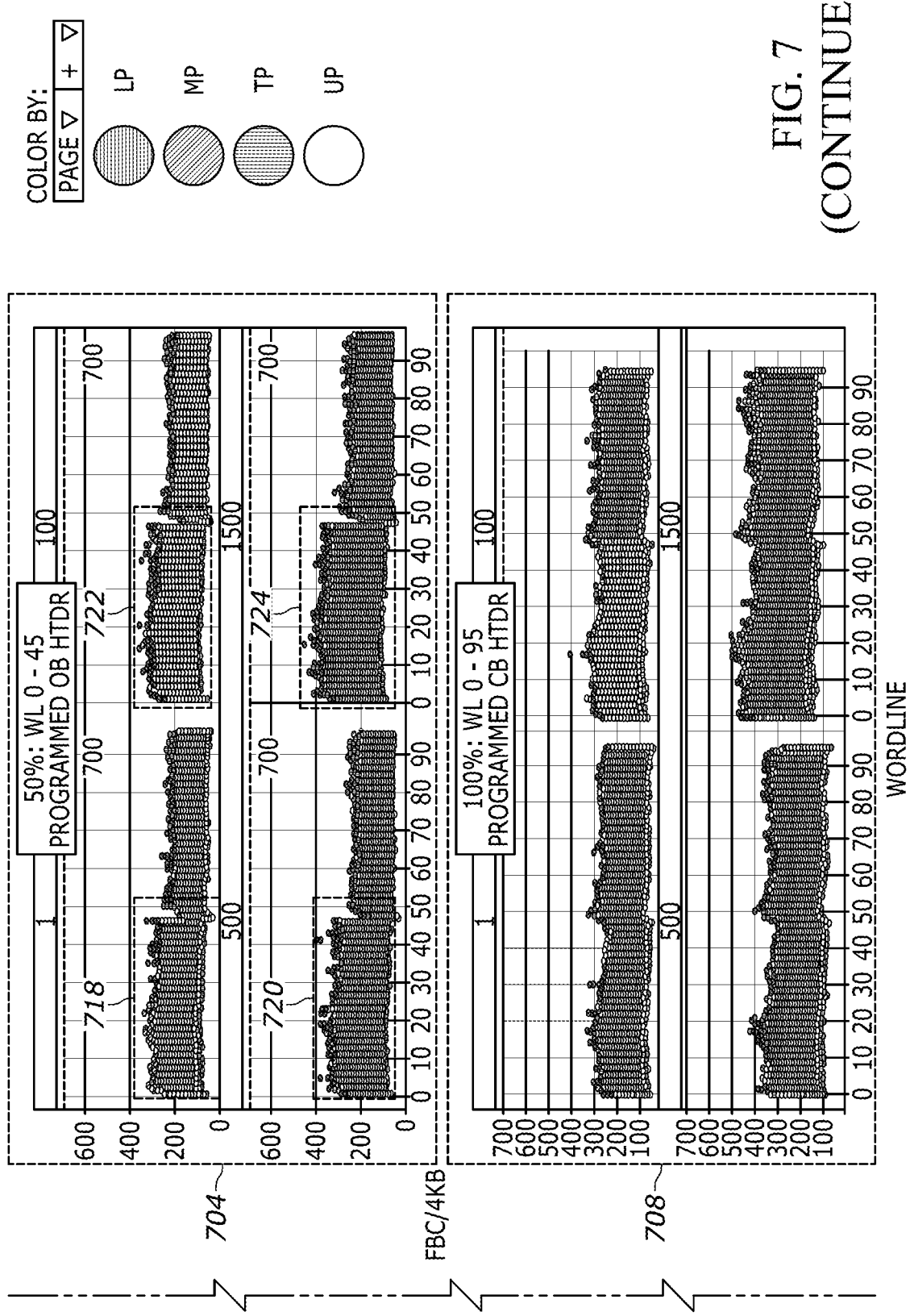

FIG. 7 is a diagram illustrating failed bit counts across wordlines with respect to four different example tests 702-708 of foggy-fine programming that reduces neighbor wordline interference (referred to as "foggy-fine programming 700"), in accordance with some embodiments of the disclosure. FIG. 7 is similar and comparable to FIG. 4. Additionally, the foggy-fine programming 700 is similar to the foggy-fine programming 600 described above in FIG. 6.

As illustrated in FIG. 7, the first example test 702 is the foggy-fine programming 700 with respect to wordline zero (WL0) programmed open block (OB) condition during high temperature data retention (HTDR) test. The second example test 704 is the foggy-fine programming 700 with respect to wordline zero (WL0) to wordline forty-seven (WL47) programmed OB HTDR. The third example test 706 is the foggy-fine programming 700 with respect to wordline zero (WL0) to wordline ninety-four (WL94) programmed OB HTDR. The fourth example test 708 is the foggy-fine programming 700 with respect to wordline zero (WL0) to wordline ninety-five (WL95) programmed closed block HTDR.

In the example test 702, a first sub-test has a failed bit count 710 of approximately 300 over four kilobytes. In the example test 702, a second sub-test has a failed bit count 712 of approximately 300 over four kilobytes. In the example test 702, a third sub-test has a failed bit count 714 of approximately 400 over four kilobytes. In the example test 702, a fourth sub-test has a failed bit count 716 of approximately 400 over four kilobytes. As illustrated in the example test 702 of FIG. 7, the NWI has clearly been reduced with respect to the comparative example test 402 of FIG. 4 because there are no spikes in failed bit count in the example test 702.

In the example test 704, a first sub-test has a failed bit count section 718 with an average of approximately 300 over four kilobytes. In the example test 704, a second sub-test has a failed bit count section 720 with an average of approximately 300 over four kilobytes. In the example test 704, a third sub-test has a failed bit count section 722 with an average of approximately 350 over four kilobytes. In the example test 704, a fourth sub-test has a failed bit count section 724 with an average of approximately 400 over four kilobytes. As illustrated in the example test 704 of FIG. 7, the NWI has clearly been reduced with respect to the fourth X in the comparative example test 404 of FIG. 4.

In the example test 706, a first sub-test has a failed bit count 726 of approximately 300 over four kilobytes. In the example test 706, a second sub-test has a failed bit count 728 of approximately 300 over four kilobytes. In the example test 706, a third sub-test has a failed bit count 730 of approximately 300 over four kilobytes. In the example test 706, a fourth sub-test has a failed bit count 732 of approximately 400 over four kilobytes. As illustrated in the example test 706 of FIG. 7, the NWI has clearly been reduced with respect to the comparative example test 406 of FIG. 4 because there are no spikes in failed bit count in the example test 706.

In the example test 708, a first sub-test has a failed bit count an average of approximately 300 over four kilobytes. In the example test 708, a second sub-test has a failed bit count average of approximately 300 over four kilobytes. In the example test 708, a third sub-test has a failed bit count average of approximately 375 over four kilobytes. In the example test 708, a fourth sub-test has a failed bit count average of approximately 450 over four kilobytes. As illustrated in the example test 708 of FIG. 7, the NWI has no effect in the example test 708 of FIG. 7 and the comparative example test 408 of FIG. 4 because both examples 408 and 708 close a fully programmed block and a closed fully programmed block provides no opportunity for NWI to have an effect on any of the wordlines.

Figure 8:
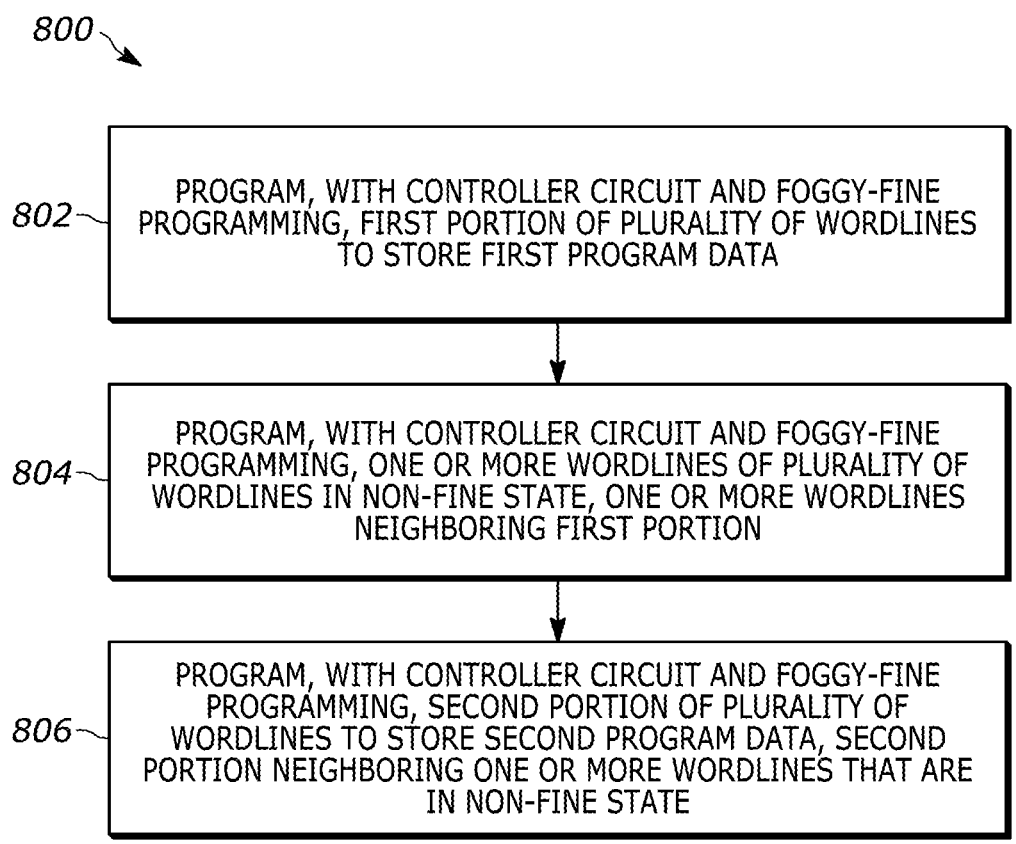
FIG. 8 is a flowchart illustrating a process for performing foggy-fine programming that reduces neighbor wordline interference, in accordance with some embodiments of the disclosure.

FIG. 8 is a flowchart illustrating a process 800 for performing foggy-fine programming that reduces neighbor wordline interference, in accordance with some embodiments of the disclosure. FIG. 8 is described with reference to FIG. 1.

The method 800 includes programming, with a controller circuit and foggy-fine programming, a first portion of a plurality of wordlines to store first program data (at block 802). For example, the controller 120 executes the foggy-fine programming with NWI reduction 160 to program a first portion (e.g., the wordlines 624 of FIG. 6) of the plurality of wordlines to store first program data (e.g., the WLn program).

The method 800 includes programming, with the controller circuit and the foggy-fine programming, one or more wordlines of the plurality of wordlines in a non-fine state, the one or more wordlines neighboring the first portion (at block 804). For example, the controller 120 executes the foggy-fine programming with NWI reduction 160 to program one or more wordlines (e.g., the wordline 618 of FIG. 6) of the plurality of wordlines in a non-fine state, the one or more wordlines neighboring the first portion.

The method 800 includes programming, with the controller circuit and the foggy-fine programming, a second portion of the plurality of wordlines to store second program data, the second portion neighboring the one or more wordlines (at block 806). For example, the controller 120 executes the foggy-fine programming with NWI reduction 160 to program a second portion (e.g., the wordlines 626 of FIG. 6) of the plurality of wordlines to store second program data (e.g., a WLn+2 program), the second portion neighboring the one or more wordlines.

In some examples, the controller 120 executes the foggy-fine programming with NWI reduction 160 to maintain the one or more wordlines in an erase state in order to program the one or more wordlines of the plurality of wordlines in the non-fine state. In other examples, the controller 120 executes the foggy-fine programming with NWI reduction 160 to program the one or more wordlines in a foggy state in order to program the one or more wordlines of the plurality of wordlines in the non-fine state.

In some examples, the method 800 may further include programming a second one or more wordlines of the plurality of wordlines in a second non-fine state, the second one or more wordlines neighboring the first portion and not neighboring the one or more wordlines. For example, the controller 120 executes the foggy-fine programming with NWI reduction 160 to program a second one or more wordlines (WL0) of the plurality of wordlines in a second non-fine state, the second one or more wordlines neighboring the first portion.

In some examples, the controller 120 executes the foggy-fine programming with NWI reduction 160 to maintain the second one or more wordlines in an erase state in order to program the second one or more wordlines of the plurality of wordlines in the non-fine state.

In some examples, the one or more wordlines and the second one or more wordlines are each a single wordline. In other examples, the one or more wordlines is a single wordline and the second one or more wordlines is more than one wordlines. In yet other examples, the one or more wordlines is more than one wordline and the second one or more wordlines is a single wordline.

In some examples, programming the second portion of the plurality of wordlines to store the second program data further includes programming the one or more wordlines in a fine state, and programming the second portion of the plurality of wordlines to store the second program data in response to programming the one or more wordlines in the fine state.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A memory controller, comprising:
   a memory interface configured to interface with a memory having a plurality of wordlines; and
   a controller circuit configured to:
      program, with foggy-fine programming, a first portion of the plurality of wordlines to store first program data,
      program, with the foggy-fine programming, one or more wordlines of the plurality of wordlines in a non-fine state, the one or more wordlines neighboring the first portion, and
      program, with the foggy-fine programming, a second portion of the plurality of wordlines to store second program data that is distinct from the first program data, the second portion neighboring the one or more wordlines.

2. The memory controller of claim 1, wherein, to program the one or more wordlines of the plurality of wordlines in the non-fine state, the controller circuit is further configured to maintain the one or more wordlines in an erase state.

3. The memory controller of claim 1, wherein, to program the one or more wordlines of the plurality of wordlines in the non-fine state, the controller circuit is further configured to program the one or more wordlines in a foggy state.

4. The memory controller of claim 1, wherein the controller circuit is further configured to program, with the foggy-fine programming, a second one or more wordlines of the plurality of wordlines in a second non-fine state, the second one or more wordlines neighboring the first portion and not neighboring the one or more wordlines.

5. The memory controller of claim 4, wherein, to program the second one or more wordlines of the plurality of wordlines in the second non-fine state, the controller circuit is further configured to maintain the second one or more wordlines in an erase state.

6. The memory controller of claim 1, wherein the one or more wordlines is a single wordline.

7. The memory controller of claim 1, wherein to program, with the foggy-fine programming, the second portion of the plurality of wordlines to store the second program data, the controller circuit is configured to
   program the one or more wordlines in a fine state, and
   program the second portion of the plurality of wordlines to store the second program data in response to programming the one or more wordlines in the fine state.

8. A method, comprising:
   programming, with a controller circuit and foggy-fine programming, a first portion of a plurality of wordlines to store first program data;
   programming, with the controller circuit and the foggy-fine programming, one or more wordlines of the plurality of wordlines in a non-fine state, the one or more wordlines neighboring the first portion, and
   programming, with the controller circuit and the foggy-fine programming, a second portion of the plurality of wordlines to store second program data that is distinct from the first program data, the second portion neighboring the one or more wordlines.

9. The method of claim 8, wherein programming the one or more wordlines of the plurality of wordlines in the non-fine state further includes maintaining the one or more wordlines in an erase state.

10. The method of claim 8, wherein programming the one or more wordlines of the plurality of wordlines in the non-fine state further includes programming the one or more wordlines in a foggy state.

11. The method of claim 8, further comprising:
    programming a second one or more wordlines of the plurality of wordlines in a second non-fine state, the second one or more wordlines neighboring the first portion and not neighboring the one or more wordlines.

12. The method of claim 11, wherein programming the second one or more wordlines of the plurality of wordlines in the second non-fine state further includes maintaining the second one or more wordlines in an erase state.

13. The method of claim 8, wherein the one or more wordlines is a single wordline.

14. The method of claim 8, wherein to programming the second portion of the plurality of wordlines to store the second program data further includes:
    programming the one or more wordlines in a fine state, and
    programming the second portion of the plurality of wordlines to store the second program data in response to programming the one or more wordlines in the fine state.

15. An apparatus, comprising:
    means for programming, with foggy-fine programming, a first portion of a plurality of wordlines to store first program data using foggy-fine programming;
    means for programming, with the foggy-fine programming, one or more wordlines of the plurality of wordlines in a non-fine state, the one or more wordlines neighboring the first portion; and
    means for programming, with the foggy-fine programming, a second portion of the plurality of wordlines to store second program data that is distinct from the first program data, the second portion neighboring the one or more wordlines.

16. The apparatus of claim 15, wherein the means for programming the one or more wordlines of the plurality of wordlines in the non-fine state further includes means for maintaining the one or more wordlines in an erase state.

17. The apparatus of claim 15, wherein the means for programming the one or more wordlines of the plurality of wordlines in the non-fine state further includes means for programming the one or more wordlines in a foggy state.

18. The apparatus of claim 15, further comprising:
means for programming, with the foggy-fine programming, a second one or more wordlines of the plurality of wordlines in a second non-fine state, the second one or more wordlines neighboring the first portion and not neighboring the one or more wordlines.

19. The apparatus of claim 18, wherein the means for programming the second one or more wordlines of the plurality of wordlines in the second non-fine state further includes means for maintaining the second one or more wordlines in an erase state.

20. The apparatus of claim 15, wherein the means for programming the second portion of the plurality of wordlines to store the second program data further includes:
means for programming the one or more wordlines in a fine state, and
means for programming the second portion of the plurality of wordlines to store the second program data in response to programming the one or more wordlines in the fine state.

* * * * *